(12) United States Patent
Chen et al.

(10) Patent No.: US 11,361,875 B2
(45) Date of Patent: Jun. 14, 2022

(54) CONTROL METHOD FOR FAST TRAPPING AND HIGH-FREQUENCY MUTUAL EJECTION OF COLD ATOM GROUPS

(71) Applicant: No. 717 Research Institute of China Shipbuilding Industry Corporation, Wuhan (CN)

(72) Inventors: Fusheng Chen, Wuhan (CN); Haicen Mao, Wuhan (CN); Jun Cheng, Wuhan (CN); Chen Huang, Wuhan (CN); Bin Wang, Wuhan (CN); Kangqi Liu, Wuhan (CN); Jiapeng Zhou, Wuhan (CN)

(73) Assignee: NO. 717 RESEARCH INSTITUTE OF CHINA SHIPBUILDING INDUSTRY CORPORATION, Wuhan (CN)

( * ) Notice: Subject to any disclaimer, the term of this patent is extended or adjusted under 35 U.S.C. 154(b) by 0 days.

(21) Appl. No.: 17/307,987

(22) Filed: May 4, 2021

(65) Prior Publication Data
US 2021/0265072 A1 Aug. 26, 2021

Related U.S. Application Data

(63) Continuation of application No. PCT/CN2018/125557, filed on Dec. 29, 2018.

(30) Foreign Application Priority Data

Dec. 12, 2018 (CN) .......................... 201811520320.4

(51) Int. Cl.
*G21K 1/00* (2006.01)
*G21K 1/093* (2006.01)
(Continued)

(52) U.S. Cl.
CPC ............. *G21K 1/093* (2013.01); *G21K 1/006* (2013.01); *G21K 1/02* (2013.01); *H03L 7/26* (2013.01); *G01B 9/02015* (2013.01)

(58) Field of Classification Search
CPC .......... G21K 1/093; G21K 1/006; G21K 1/02; G01B 9/02015
See application file for complete search history.

(56) References Cited

U.S. PATENT DOCUMENTS

| 8,835,833 | B2 * | 9/2014 | Du | G21K 1/006 250/251 |
| 9,897,448 | B2 * | 2/2018 | Johnson | G01P 15/08 |

(Continued)

FOREIGN PATENT DOCUMENTS

| WO | WO2019040817 | 3/2016 |
| WO | WO2018154254 | 8/2018 |

*Primary Examiner* — Wyatt A Stoffa

(57) ABSTRACT

The present application discloses a control method for fast trapping and high-frequency mutual ejection of cold atom groups. The control method includes: arranging three groups of optical stops on three groups of light sources (splitters) in three-dimensional magneto-optical traps, to form a shaded regions; ejecting a cold atom group from the first three-dimensional magneto-optical trap along a movement trajectory to the second three-dimensional magneto-optical trap, where the movement trajectory passes through the shaded regions of the two three-dimensional magneto-optical traps; and, when it is determined that the cold atom group enters the shaded region of the first three-dimensional magneto-optical trap, trapping a next cold atom group by turning on three-dimensional cooling light and three-dimensional repumping light in the first three-dimensional magneto-optical trap.

2 Claims, 2 Drawing Sheets

(51) Int. Cl.
*G21K 1/02* (2006.01)
*H03L 7/26* (2006.01)
*G01B 9/02015* (2022.01)

(56) References Cited

U.S. PATENT DOCUMENTS

| | | | | |
|---|---|---|---|---|
| 11,175,139 | B2* | 11/2021 | Barrett | G01P 15/08 |
| 2014/0190254 | A1* | 7/2014 | Bouyer | G01V 7/04 |
| | | | | 73/382 G |
| 2019/0376790 | A1 | 12/2019 | Ixblue et al. | |
| 2020/0025639 | A1* | 1/2020 | Madison | G21K 1/006 |
| 2021/0262797 | A1* | 8/2021 | Chen | G01C 19/58 |

* cited by examiner

CONTROL METHOD FOR FAST TRAPPING AND HIGH-FREQUENCY MUTUAL EJECTION OF COLD ATOM GROUPS

CROSS-REFERENCE TO RELATED APPLICATIONS

This application claims priority to China Patent Application No. 201811520320.4, filed on Dec. 12, 2018, the content of which is hereby incorporated by reference in its entirety. This application is a continuation of international patent application PCT/CN2018/125557, filed on Dec. 29, 2018, the content of which is also hereby incorporated by reference in its entirety.

TECHNICAL FIELD

The present application relates to the technical field of cold atom trapping, and specifically, to a control method for fast trapping and high-frequency mutual ejection of cold atom groups.

BACKGROUND

Atoms in an ultracold state gradually exhibit a wave nature. Therefore, atoms are prepared in an ultracold state to cause interference between atomic matter waves, to measure physical information carried by the atomic matter waves in an ejection path. With the development of cold atom technology, a cold atom interferometer has been used to perform high precision measurement on a physical quantity such as a physical constant, gravitational acceleration, a gravitational gradient, and a rotation.

A working procedure of a cold atom interferometer may include four stages: a trapping stage, an ejection stage, an interference stage, and a detection stage of an interference signal. Because of the characteristics of the cold atom interferometer, there are different requirements for light and magnetic fields in the stages. Therefore, to avoid interference between the stages, an existing cold atom interferometer usually completes the ejection of a group of cold atoms before trapping a next group of cold atoms. When more cold atoms participate in interference, a cold atom interference phenomenon is clearer, and a measurement result is more accurate. Therefore, it is expected that the time of the trapping stage is extended as much as possible, to make the measurement precision of the interferometer reach a relatively high level.

In the prior art, in combination with the detection efficiency and detection precision of a cold atom interferometer, within a running period of the cold atom interferometer, after an interference stage of a group of cold atoms is completed, a next group of cold atoms are still in a trapping stage or an ejection stage. This period is referred to as a measurement dead zone. Theoretically, the ejection frequency of cold atom groups may be increased to implement dead-zone-free measurement. That is, as soon as one complete interference loop is completed for a cold atom group that is ejected first, a next cold atom group that is ejected subsequently is about to enter an interference loop. However, there are a relatively small quantity of atoms in the cold atom group ejected at this time, and it is impossible to provide sufficient measurement information. As a result, the measurement precision of the cold atom interferometer is relatively low. In addition, the structure of the cold atom interferometer is limited. Therefore, it is impossible to simply increase the ejection frequency of cold atom groups to implement dead-zone-free measurement of the cold atom interferometer.

SUMMARY

An objective of the present application is to increase the measurement precision of a cold atom interferometer and the ejection frequency of cold atom groups, to reduce a possibility that the cold atom interferometer has a measurement dead zone.

The technical solution of the present application is as follows: A control method for fast trapping and high-frequency mutual ejection of cold atom groups is provided, used for a cold atom interferometer. The interferometer has two groups of cold atom group ejection mechanisms, the two groups of cold atom group ejection mechanisms eject cold atom groups towards each other, and each group of cold atom ejection mechanisms includes: an atomic generator, a two-dimensional magneto-optical trap, and a three-dimensional magneto-optical trap. The method includes: Step 01. respectively arranging three groups of optical stops besides three groups of light sources (the light sources may be devices that emit light or may be splitters configured to relay light from an external light source) in two three-dimensional magneto-optical traps, where the three groups of optical stops are configured to form shaded regions, a predetermined angle is formed between an optical path of the first group of light sources and an atomic beam path, two light sources of the first group of light sources respectively point to a trapping region in the atomic beam path, the first group of optical stops are respectively arranged at edge of the optical path of the first group of light sources and downstream of the atomic beam path, the first group of optical stops block laser light emitted from the first group of light sources, an optical path of the second group of light sources is arranged orthogonally with respect to the optical path of the first group of light sources, the second group of optical stops are arranged at an edge of the optical path of the second group of light sources and downstream of the atomic beam path, the second group of optical stops block laser light emitted from the second group of light sources, an optical path of the third group of light sources is arranged orthogonally with respect to the optical path of the second group of light sources and the optical path of the third group of light sources, the third group of optical stops are arranged at an edge of the optical path of the third group of light sources and downstream of the atomic beam path, and the third group of optical stops block laser light emitted from the third group of light sources, where the optical axis of the laser light emitted by each of the three groups of light sources is orthogonal to the optical axes of the other two light sources, and an intersecting region of the three groups of laser light is used as the trapping region; Step 02. ejecting a cold atom group from the first three-dimensional magneto-optical trap along a first movement trajectory to the second three-dimensional magneto-optical trap, where the first movement trajectory passes through the shaded regions of the two three-dimensional magneto-optical traps; and Step 03. when it is determined that the cold atom group enters the shaded region of the first three-dimensional magneto-optical trap, trapping a next cold atom group, for example, by turning on three-dimensional cooling light and three-dimensional repumping light in the first three-dimensional magneto-optical trap. The process of trapping cold atom group is well known to a person skilled in the art.

Preferably, Step 02 specifically includes the following steps: Step 02*a*. when it is determined that the quantity of cold atoms in the cold atom group is greater than or equal to a preset value, turning off currents in magnetic field coils in the three-dimensional magneto-optical traps; Step 02*b*. adjusting the ejection direction and strength of cold atoms in the three-dimensional magneto-optical traps according to the movement trajectory, for example, by adjusting the light intensity of the three-dimensional cooling light and the light intensity of the three-dimensional repumping light of the three-dimensional magneto-optical traps; and Step 02*c*. when it is determined that the cold atom group can move along the movement trajectory, stopping adjusting the ejection direction and strength of the cold atoms, for example, by turning off the three-dimensional cooling light and the three-dimensional repumping light in the three-dimensional magneto-optical traps.

Preferably, Step 02 specifically further includes: ejecting the cold atom group from the first three-dimensional magneto-optical trap to the second three-dimensional magneto-optical trap at a preset speed, where when being ejected at the preset speed, the cold atom group enters the trapping region of the second three-dimensional magneto-optical trap before the three-dimensional cooling light and the three-dimensional repumping light in the second three-dimensional magneto-optical trap are turned off.

The beneficial effect of the present application is as follows: by arranging an optical stop at edge of the optical path of each light source of the three-dimensional magneto-optical trap, and a shaded region is formed in a trapping region, so that a wait time for a cold atom group to fly out of the trapping region is reduced. Next, when it is determined that the cold atom group enters the shaded region, the trapping function of the three-dimensional magneto-optical traps are turned on by turning on three-dimensional cooling light and three-dimensional repumping light, to reduce the waiting time for the cold atom group leaving the trapping region (since it does not need to wait the cold atom group to leave the shaded region) and increase the ejection frequency of the cold atom interferometer, thereby implementing dead-zone-free measurement of the cold atom interferometer.

BRIEF DESCRIPTION OF DRAWINGS

The advantages in the foregoing and/or additional aspects of the present application will become apparent and more comprehensible from the following description of the embodiments with reference to the accompanying drawings.

REFERENCE NUMBERS IN FIG. 5

401 Intensity of 2-D cooling light and back-pumping light
402 Intensity of 2-D push-off light
403 Intensity of 3-D magnetic filed
404 Density of 3-D cooling light and back-pumping light
405 Frequency of 3-D cooling light

DETAILED DESCRIPTION

To make the objectives, features, and advantages of the present application more comprehensible, the present application is further described below in detail with reference to the accompanying drawings and specific implementations. It needs to be noted that the embodiments in the present application and the features in the embodiments may be combined with each other without causing any conflict.

In the following descriptions, many specific details are described to make the present application fully comprehensible. However, the present application may be implemented in other manners different from those described herein. Therefore, the protection scope of the present application is not limited to specific embodiments disclosed below.

Figure 1:
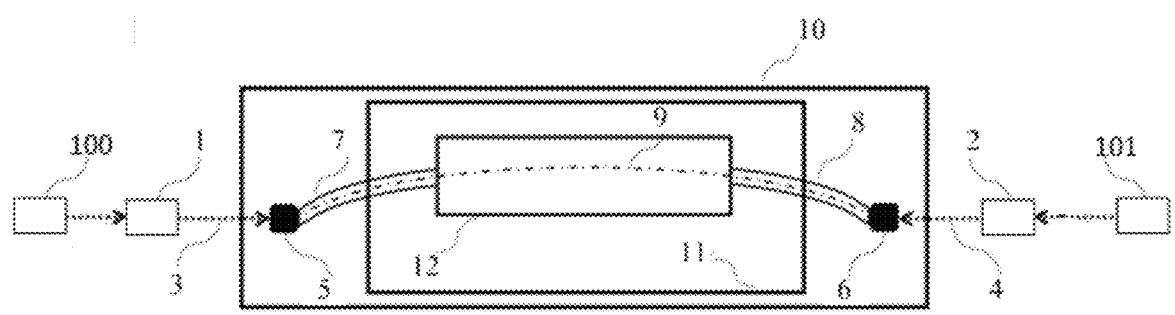
FIG. 1 is a schematic diagram of a cold atom interferometer configured to perform a method in the present invention.

As shown in FIG. 1, this embodiment provides a dead-zone-free cold atom interferometer with a high frequency output, having two groups of cold atom group ejection mechanisms. The two groups of cold atom group ejection mechanisms eject cold atom groups to/towards each other. Each group of cold atom ejection mechanisms includes:

an atomic generator (100,101), a two-dimensional magneto-optical trap (1,2), and a three-dimensional magneto-optical trap (5,6). The atomic generator is configured to: generate an atomic beam, and transmit the atomic beam to the two-dimensional magneto-optical trap. The two-dimensional magneto-optical trap is configured to: receive the atomic beam, and cool the atoms in the atomic beam, to increase the quantity of cold atoms that enter the three-dimensional magneto-optical trap. A first two-dimensional magneto-optical trap 1 is positioned before a first three-dimensional magneto-optical trap 5. A second two-dimensional magneto-optical trap 2 is positioned before a second three-dimensional magneto-optical trap 6. The cold atom interferometer further includes a first tube 7, a second tube 8, an outer shielding case 10, an inner shielding case 11, and an interference cavity 12. A cold atom group ejected by the three-dimensional magneto-optical trap moves along a path 9 in the interference cavity 12.

The control method of the present embodiment includes: generating atomic beams by using atomic generators 100 and 101 separately, transmitting the atomic beams to respective two-dimensional magneto-optical traps, and cooling atoms in the atomic beams by using the two-dimensional magneto-optical traps.

Figure 2:
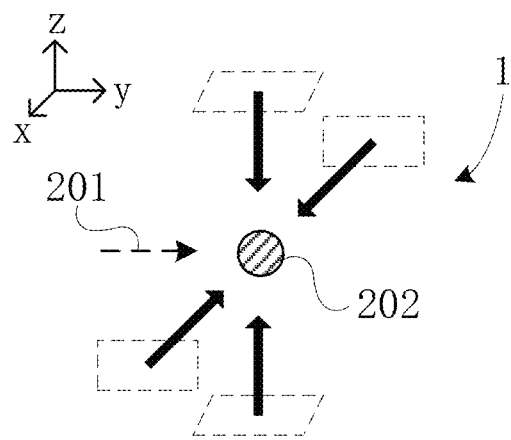
FIG. 2 is a schematic diagram of a two-dimensional magneto-optical trap in FIG. 1.

The two-dimensional magneto-optical traps are configured to provide cold atoms to three-dimensional magneto-optical traps. The process that the first two-dimensional magneto-optical trap 1 emits cold atoms to the first three-dimensional magneto-optical trap 5 is shown in FIG. 2. Two-dimensional pushing light 201 radiates in the y-axis positive direction to a two-dimensional magneto-optical trap trapping region 202, to push cold atoms in the two-dimensional magneto-optical trap trapping region 202 to enter the first three-dimensional magneto-optical trap 5 along a path 3 (in a movement direction of the cold atoms). Correspondingly, cold atoms trapped in the second two-dimensional magneto-optical trap 2 enter the second three-dimensional magneto-optical trap 6 along a path 4 (in the movement direction of the cold atoms).

If the light source is not a source that can directly emit light, but a light splitter for splitting light. The cold atom interferometer further includes one laser light generator and a plurality of groups of light sources. The laser light generator is configured to emit laser light to the light sources. The light sources perform light splitting, to provide laser light (for example, cooling light, and repumping light) required for the two-dimensional magneto-optical traps and the three-dimensional magneto-optical traps.

Figure 3:
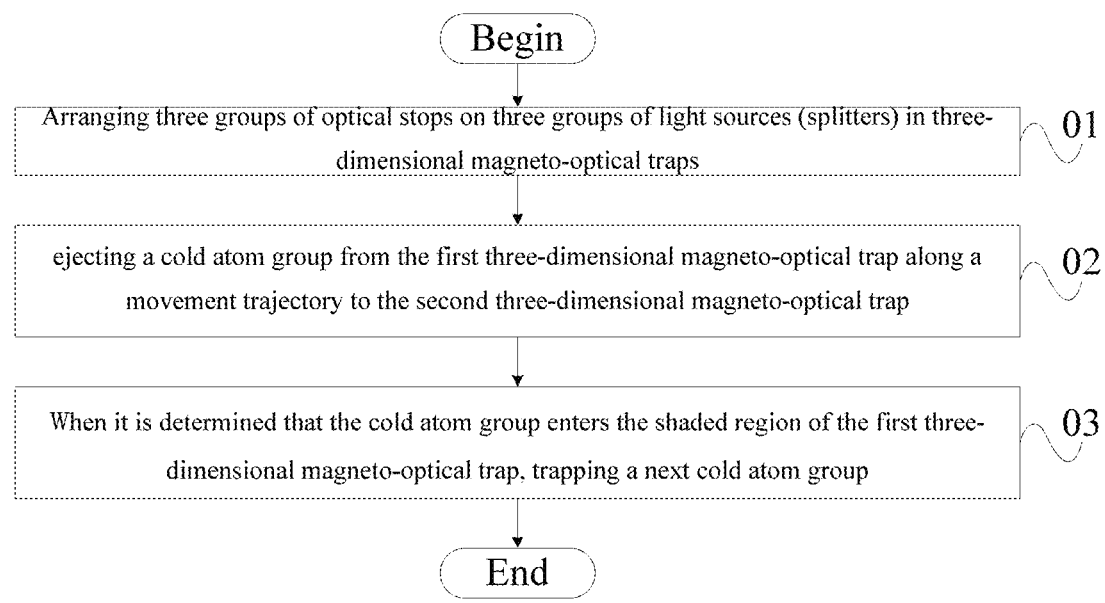
FIG. 3 is a schematic flowchart of a control method according to the present invention.

As shown in FIG. 3, a control method for fast trapping and high-frequency mutual ejection of cold atom groups in this embodiment includes the following steps:

Step 01. Arrange three groups of optical stops on edges of optical axes of the three groups of light sources in two three-dimensional magneto-optical traps, where the three groups of optical stops are configured to form a shaded region, a predetermined angle is formed between an optical path of the first group of light sources and the atomic beam path. The two light sources of the first group of light sources respectively point to a trapping region in the atomic beam path, each optical stop of the first group of optical stops is arranged at an edge of the optical path of one light source of the first group of light sources and downstream of the atomic beam path, the first group of optical stops partially block laser light emitted from the first group of light sources respectively. The optical path of the second group of light sources is orthogonal to the optical paths of the first and the third group of light sources, each optical stop of the second group of optical stops is arranged at the edge of the optical path of the second group of light sources and downstream of the atomic beam path. The second group of optical stops partially block laser light emitted from the second group of light sources respectively. The optical path of the third group of light sources is orthogonal to the optical paths of the second group of light sources and the third group of light sources, the third group of optical stops are arranged at one edge of the optical path of the third group of light sources and downstream of the atomic beam path, and the third group of optical stops partially block laser light emitted from the third group of light sources respectively, where the laser light emitted by the three groups of light sources is irradiated to a target region in a two-by-two orthogonal form, and an intersecting region of the three groups of laser light is used as the trapping region.

Figure 4:
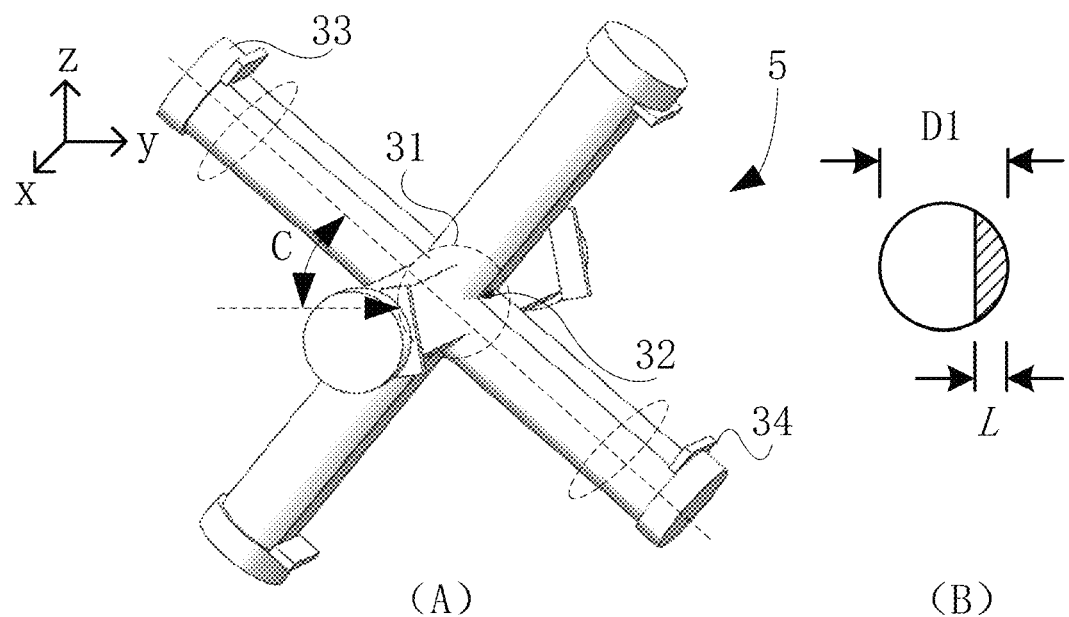
FIG. 4 is a schematic diagram of a three-dimensional magneto-optical trap shown in FIG. 1.

Specifically, the first three-dimensional magneto-optical trap 5 in a cold atom interferometer is used as an example and described in detail. As shown in FIG. 4, an xyz 3D coordinate system is introduced. A direction indicated by a dotted arrow in FIG. 4 (A) is a direction of the atomic beam path. That is, the atomic beam path is arranged along the y-axis. In this case, the downstream direction of the atomic beam path is in the y-axis positive direction. The optical axes of the first group of light sources and the second group of light sources in the first three-dimensional magneto-optical trap 5 are parallel to/located in the yz plane. The optical axis of the third group of light sources is along the x axis. The center of a trapping region 31 is located at the origin of the xyz 3D coordinate system. A shaded region 32 is located above the xy plane. An angle between the optical path of the first group of light sources and the y-axis negative direction satisfies a preset angle C. A value range of the preset angle C is 10° to 40°. The optical path of the second group of light sources is orthogonal to the optical path of the first group of light sources. The optical path of the third group of light sources is orthogonal to the optical paths of the first group of light sources and the second group of light sources. Three-dimensional cooling light emitted from the three groups of light sources intersects in the trapping region 31 of the first three-dimensional magneto-optical trap 5. To increase the emission frequency of cold atom groups, in case that the quantity of cold atoms in a cold atom group is enough to implement dead-zone-free measurement of the cold atom interferometer, optical stops 34 are respectively arranged on side portions of optical paths of the three groups of light sources. The first group of optical stops are arranged above the edge of the optical path of the first group of light sources. The second group of optical stops are arranged below the optical path of the second group of light sources. The third group of optical stops are arranged on the right side of the optical path of the third group of light sources. That is, the three groups of optical stops are located downstream of the atomic beam path (near the y-axis positive direction). The optical stops 34 are arranged to partially block cooling light emitted by the light sources, to make it convenient to form the shaded region 32 in the trapping region 31.

The shaded region 32 is formed by the optical stops 34. When it is determined that a cold atom group enters the shaded region 32 of the trapping region 31 but has not left the trapping region 31, the trapping function of the three-dimensional magneto-optical traps is turned on, e.g., by turning on the three-dimensional cooling light and three-dimensional repumping light. Thus, it can reduce a wait time for the cold atom group to fly out of the trapping region 31 and to increase the ejection frequency of cold atom groups, since it does not need the cold atom group fly out of the shaded region 32 and can turn on the trapping function of the three-dimensional magneto-optical traps earlier. This time, the three-dimensional cooling light and the three-dimensional repumping light in the three-dimensional magneto-optical traps are turned on. In addition, the volume of an effective trapping region of the three-dimensional magneto-optical traps is ensured, which is conducive to increasing a quantity of cold atoms trapped in the cold atom group, thereby implementing dead-zone-free measurement of the cold atom interferometer.

Further, blocking widths of blocking the three groups of light sources by the three groups of optical stops are the same, and a calculation formula of the blocking width is: $L=[((D1-D2))/n]$, wherein L represents the blocking width, D1 represents diameter of the collimators of the light sources, D2 is the diameter of the cold atom group, and n is a preset coefficient.

Specifically, as shown in FIG. 4 (B), it is set that a collimator diameter of a light source 33 is D1, a cold atom group diameter of the cold atom group trapped by the three-dimensional magneto-optical traps is D2, and a calculation formula of the blocking width L is: $L=\lfloor((D1-D2))/n\rfloor$, wherein the preset coefficient n is generally 4. To ensure the volume of the three-dimensional trapping region 31, a calculation result of the blocking width L is rounded down. For example, it is set that the collimator diameter is D1=22 mm, and the diameter of the cold atom group is D2=4.5 mm. The calculated blocking width is L=4 mm.

Step 02. Eject a cold atom group from the first three-dimensional magneto-optical trap along a movement trajectory to the second three-dimensional magneto-optical trap, where the movement trajectory passes through the shaded regions of the two three-dimensional magneto-optical traps.

The step 02 specifically includes the following steps:

Step 02a. When it is determined that the quantity of cold atoms in the cold atom group is greater than or equal to a preset value, remove the magnetic field in the three-dimensional magneto-optical traps by turning off currents in magnetic field coils in the three-dimensional magneto-optical traps.

Figure 5:
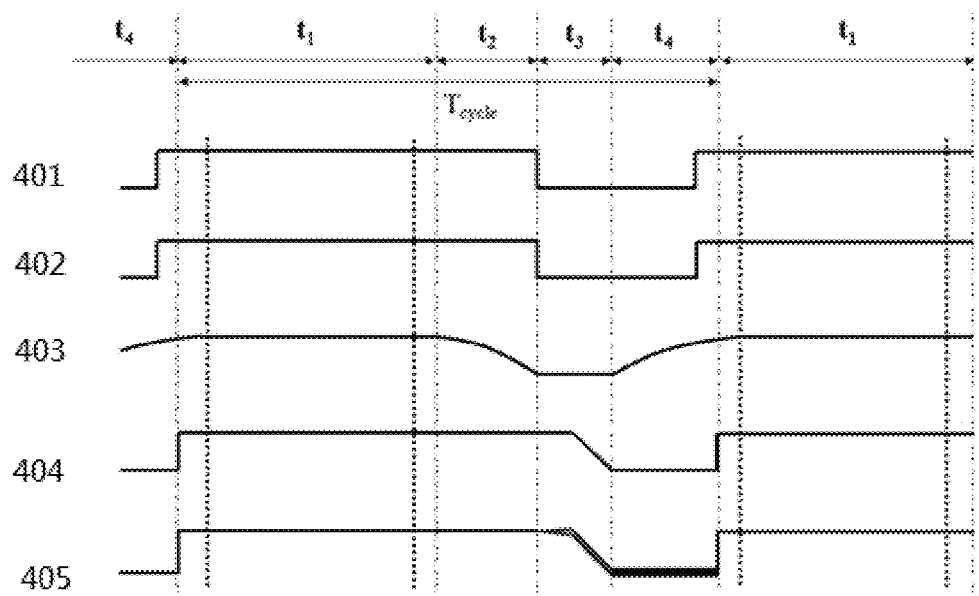
FIG. 5 is a control timing diagram of a control method according to the present invention.

Specifically, as shown in FIG. 5, the adjustment of two-dimensional magneto-optical traps and the three-dimensional magneto-optical traps in the cold atom interferometer may include four preset periods: a trapping stage t1, a magnetic field turn-off stage t2, an adjustment stage t3, and an ejection wait stage t4.

Further, Step 20 specifically further includes the following step: ejecting the cold atom group from the first three-dimensional magneto-optical trap to the second three-dimensional magneto-optical trap at a preset speed, wherein when being ejected at the preset speed, the cold atom group enters the trapping region of the second three-dimensional magneto-optical trap before the three-dimensional cooling light and the three-dimensional repumping light in the second three-dimensional magneto-optical trap are turned off.

In the trapping stage t1, cold atoms are continuously trapped. When it is determined that a quantity of trapped cold atoms is greater than or equal to the preset value, the magneto-optical trap control apparatus turns off the magnetic field coil of the three-dimensional magneto-optical trap. Specifically, the magneto-optical trap control apparatus sets both the two-dimensional magneto-optical trap and the three-dimensional magneto-optical trap to a working state, and the two-dimensional magneto-optical trap emits cooled atoms to the three-dimensional magneto-optical trap. The three-dimensional magneto-optical trap traps the cold atoms, to form a first cold atom group. In a running process of cold atom interference, the cold atom interferometer uses the first three-dimensional magneto-optical trap 5 to eject the first cold atom groups to the second three-dimensional magneto-optical trap 6 at the preset speed, so that after being ejected, the first cold atom group can enter the trapping region in the second three-dimensional magneto-optical trap 6 in the trapping stage t1. Thus, the first three-dimensional magneto-optical trap 5 can further receive a second cold atom group emitted by the second three-dimensional magneto-optical trap 6. Therefore, in the trapping stage t1, the first three-dimensional magneto-optical trap 5 further traps the second cold atom group, and fuse the first cold atom group and the second cold atom group to form a third cold atom group. The lasting time of the trapping stage t1 is usually determined by the quantity of atoms in the third cold atom group.

In the magnetic field turn-off stage t2, after the third cold atom group is formed, the magneto-optical trap control apparatus turns off an anti-Helmholtz magnetic field coil in the three-dimensional magneto-optical trap. A magnetic field in the three-dimensional magneto-optical trap gradually decreases. The magnetic binding force applied to the atoms in the third cold atom group gradually decreases, and the third cold atom group diffuses. In addition, the atoms collide with each other, resulting in a temperature rise in the third cold atom group. Therefore, the lasting time of the magnetic field turn-off stage t2 is preferably as small as possible. After a magnetic field generated by the anti-Helmholtz magnetic field coil is turned off, the two-dimensional magneto-optical trap is switched from the working state to the sleep state, and the two-dimensional magneto-optical trap is turned off. The two-dimensional cooling light, two-dimensional repumping light, and two-dimensional pushing light 201 therein are turned off.

Step 02b. Adjust the light intensity of the three-dimensional cooling light and the light intensity of the three-dimensional repumping light in the three-dimensional magneto-optical traps according to the movement trajectory.

Specifically, in the adjustment stage t3, when it is determined that the magnetic field generated by the magnetic field coils is zero, the light intensity of the three-dimensional cooling light and the three-dimensional repumping light in the three-dimensional magneto-optical traps is gradually reduced according to a preset proportion, and the two-dimensional magneto-optical traps are switched to a sleep state. The cold atom interferometer gradually decreases its banding force, i.e., decreases the light intensity of the three-dimensional cooling light and the three-dimensional repumping light in the three-dimensional magneto-optical traps, to enable the cold atom group to gain a particular movement speed. Thus, the cold atom group can enter the shaded region 32 formed by the optical stops 34 within the ejection-waiting-stage t4 according to the movement speed, and fly into a first tube 7 or a second tube 8 according to a movement trajectory 9. The preset proportion may be determined according to one of a polygonal function, a geometric decreasing function, or a linear function.

Step 02c. When it is determined that the cold atom group can move along the movement trajectory, turn off the three-dimensional cooling light and the three-dimensional repumping light in the three-dimensional magneto-optical traps.

Specifically, when it is determined that the cold atom group can move along the movement trajectory 9, the three-dimensional magneto-optical traps enters the ejection wait stage t4, the cold atom interferometer is further configured to: when it is determined that the cold atom group can move along the movement trajectory 9, turn off its trapping function, i.e., turn off the three-dimensional cooling light and the three-dimensional repumping light, and turn on the magnetic field coils.

A calculation formula that the adjustment stage t3 and the ejection wait stage t4 satisfy is: $v \times (t_3 + t_4) = D1 - L$, wherein v represents the speed of the cold atom group gained in the adjustment stage t3.

Step 03. when it is determined that the cold atom group enters the shaded region of the first three-dimensional magneto-optical trap, trapping a next cold atom group by turning on the three-dimensional cooling light and the three-dimensional repumping light in the first three-dimensional magneto-optical trap.

Specifically, in the ejection waiting stage t4, when it is determined that a cold atom group C enters the shaded region 32 of the first three-dimensional magneto-optical trap 5 along the movement trajectory 9, the trapping function of the first three-dimensional magneto-optical trap 5 is turned on, i.e., the three-dimensional cooling light and the three-dimensional repumping light in the first three-dimensional magneto-optical trap 5 are turned on, making it convenient for the first three-dimensional magneto-optical trap 5 to enter a trapping cycle of a next cold atom group, thereby increasing the ejection frequency of cold atom groups.

By arranging the optical stops 34 in the three-dimensional magneto-optical traps, when it is determined that the cold atom group enters the shaded region 32 of the trapping region 31 but has not left the trapping region 31, the three-dimensional cooling light and the three-dimensional repumping light in the three-dimensional magneto-optical traps are turned on, and cold atoms and a new second cold atom group can enter a trapping state in advance, to reduce the duration of the ejection wait stage t4. That is, a wait time for the cold atom group to fly out of the trapping region 31 is reduced, so that the ejection frequency of the third cold atom group is increased, and dead-zone-free measurement of the cold atom interferometer is implemented. In addition, the fault tolerance of the timing control of the cold atom interferometer can also be increased.

Furthermore, the control method further includes: Step 04. adjusting the specification of an interference cavity according to an ejection time of the cold atom group from a first shaded region to a second shaded region.

Specifically, to ensure that an ejection time $t_p$ for the cold atom group to move from the first three-dimensional magneto-optical trap 5 along the movement trajectory 9 to reach the second three-dimensional magneto-optical trap 6 is in the trapping stage t1 to help to perform the function of cold atom interferometer, a relational expression that the ejection time $t_p$ should satisfy is:

$$\begin{cases} mT_{cycle} \le t_p \le (m+1)T_{cycle} + t_1 \\ t_p = f(S, v) \\ T_{cycle} = t_1 + t_2 + t_3 + t_4 \end{cases},$$

wherein, a preset multiple m is a positive integer, S is a displacement (the movement trajectory 9) in an ejection process of the cold atom group, v is the speed of the cold atom group, and f(S, v) is a calculation formula of the ejection time $t_p$.

The cold atom interferometer in the present application is applied to a navigation gyroscope. While the precision of the navigation gyroscope is ensured, that is, the quantity of cold atoms in a cold atom group for interference satisfies a predetermined request, the ejection frequency of cold atom groups is increased, thereby implementing dead-zone-free measurement of the cold atom interferometer, to enable the navigation gyroscope to implement running without a measurement window period.

A person skilled in the art should understand that if there is a measurement dead zone in the cold atom interferometer but the measurement dead zone is omittable, dead-zone-free measurement discussed in the present application can still be implemented.

According to an actual requirement, the steps in the present application may be rearranged, combined or deleted.

According to an actual requirement, the units of the apparatus in the present application may be combined, divided or deleted.

Although the present application is disclosed in detail with reference to the accompanying drawings, it should be understood that these descriptions are merely exemplary but are not intended to limit the application of the present application. The protection scope of the present application is defined by the appended claims, and may include various variations, modifications, and equivalent solutions made to the invention without departing from the protection scope and spirit of the present application.

What is claimed is:

1. A control method for fast trapping and high-frequency mutual ejection of cold atom groups, used for controlling a cold atom interferometer, wherein the cold atom interferometer has a first group of cold atom group ejection mechanism and a second group of cold atom group ejection mechanism, the two groups of cold atom group ejection mechanisms eject cold atom groups to each other, each group of cold atom ejection mechanisms comprises: an atomic generator, a two-dimensional magneto-optical trap, and a three-dimensional magneto-optical trap, and the two groups of cold atom group ejection mechanisms are disposed opposite to each other, the three-dimensional magneto-optical trap comprises three light sources and three optical stops, wherein the three light sources point to a trapping region;

for each of the two groups of cold atom group ejection mechanisms, the control method comprises:
generating atomic beams using the atomic generator;
cooling the atomic beams using the two-dimensional magneto-optical trap;
arranging the light sources so that an optical axis of each group of light sources is orthogonal to optical axes of the other two groups of light sources, and light beams of all of the light sources intersects in the trapping region;
arranging the atomic generators so that a predetermined angle is formed between an optical path of one of the light sources and a path of the atomic beams, wherein the path of the atomic beams passes through the trapping region;
arranging the optical stops so that each optical stop is placed at an edge of the optical axis of one light source and partially block laser light emitted from corresponding light source, forming shaded regions in the trapping region,
ejecting a cold atom group from a first three-dimensional magneto-optical trap along a movement trajectory to a second three-dimensional magneto-optical trap, wherein the movement trajectory passes through the shaded regions of the two three-dimensional magneto-optical traps; and
when it is determined that the cold atom group enters the shaded region of the first three-dimensional magneto-optical trap, trapping a next cold atom group.

2. The control method for fast trapping and high-frequency mutual ejection of cold atom groups according to claim 1, wherein it further comprises:
ejecting the cold atom group from the first three-dimensional magneto-optical trap to the second three-dimensional magneto-optical trap at a preset speed, so that when being ejected at the preset speed, the cold atom group enters the trapping region of the second three-dimensional magneto-optical trap before a trap function of the second three-dimensional magneto-optical trap is turned off.

* * * * *